United States Patent [19]
Ueda et al.

[11] Patent Number: 5,166,099
[45] Date of Patent: Nov. 24, 1992

[54] MANUFACTURING METHOD FOR SEMICONDUCTOR DEVICE

[75] Inventors: Tetsuya Ueda; Osami Nakagawa; Haruo Shimamoto; Yasuhiro Teraoka; Seiji Takemura, all of Itami, Japan

[73] Assignee: Mitsubishi Denki Kabushiki Kaisha, Tokyo, Japan

[21] Appl. No.: 759,912

[22] Filed: Sep. 13, 1991

[30] Foreign Application Priority Data

Sep. 14, 1990 [JP] Japan .................................. 2-244749
May 2, 1991 [JP] Japan .................................. 3-130432

[51] Int. Cl.⁵ .......................................... H01L 21/60
[52] U.S. Cl. ............................... 437/220; 437/211; 437/215; 437/217; 257/668
[58] Field of Search ............. 437/217, 220, 211, 215, 437/216; 357/70

[56] References Cited

U.S. PATENT DOCUMENTS

| | | | |
|---|---|---|---|
| 4,250,347 | 2/1981 | Fierkens | 437/217 |
| 5,041,395 | 8/1991 | Steffen | 437/217 |
| 5,057,461 | 10/1991 | Fritz | 437/217 |
| 5,064,706 | 11/1991 | Ueda | 437/220 |

Primary Examiner—Brian E. Hearn
Assistant Examiner—Kevin M. Picardat
Attorney, Agent, or Firm—Leydig, Voit & Mayer

[57] ABSTRACT

A manufacturing method for a semiconductor device in which an electrode of a semiconductor chip is electrically connected to an inner lead of a carrier tape. The electrodes of the semiconductor chip are brought into contact with the inner lead of the carrier tape. Bonding is performed with inner lead droop controlled to no more than 80 μm.

6 Claims, 12 Drawing Sheets $h_1 > 80 \mu m$ h2 < 80μm

MANUFACTURING METHOD FOR SEMICONDUCTOR DEVICE

BACKGROUND OF THE INVENTION

1. Field of the Invention

The present invention relates to a manufacturing method for a semiconductor device, in which method a mold is used to resin encapsulate a semiconductor element and a tape carrier by a method such as a low-pressure transfer.

2. Description of the Related Art

FIG. 8 is a perspective view partially in section of a conventional resin-sealed type semiconductor device. It shows how a low-pressure transfer method resin-molds a semiconductor element connected by wire bonding.

In the drawing, numeral 1 denotes the core of a semiconductor device or a semiconductor element, usually referred to as an IC chip. Electronic circuitry is finely and delicately formed on the IC chip 1 on a semiconductor substrate, made of, for example, silicon. Numeral 2 denotes a die bonding pad where the IC chip 1 is mounted. Numeral 3 denotes leads, each composed of an inner lead electrically connected to an electrode on the IC chip 1 and of an outer lead electrically connected to an external device and the substrate. Numeral 4 denotes wires electrically connecting the IC chip 1 to the leads 3, and numeral 5 denotes a sealing resin which encapsulates the IC chip 1 to protect it from external surroundings and force.

A so-called Tape Automated Bonding (TAB) method using a tape carrier is employed in place of the above wire bonding method which has been widely used as a technique for connecting the electrodes on an IC chip (a semiconductor element) 1. The TAB method will be briefly described with reference to FIGS. 9a, 9b, 10a and 10b. In the drawings, numeral 6 designates a tape, serving as a base material of the tape carrier, which is made of a flexible insulating material, such as polyimide, and has a film-like configuration. As described below, three types of holes 7-9 are formed in the tape 6. The hole 7 is a center device hole at the center of the width of the tape 6, and is situated in a position where the IC chip 1, described later, is installed. The holes 8 are sprocket holes at fixed intervals on both sides of the tape 6 in the width direction of the tape 6. The sprocket holes 8 are used for roughly positioning the tape 6 and the IC chip 1 when they are bonded together. The holes 9 are a plurality of outer-lead holes surrounding the center device hole 7. The outer-lead holes 9 are used when the outer leads are bonded as described later, and are separated by bridges 10 formed in positions corresponding to the four corners of the center device hole 7. Numeral 11 designates a plurality of lead patterns, made of an electrically conductive material, formed in predetermined positions on the obverse surface of the tape 6. Each lead pattern is composed of an inner lead 11a facing the center device hole 7, and an outer lead 11b extending over the outer-lead hole 9 and toward the outside. Numeral 11c designates test pads for examining whether the IC chip 1 is defective or whether the connection between the inner leads 11a and the IC chip 1 is defective after the inner leads have been bonded. Numeral 12 designates a lead support portion supporting the lead patterns 11, and 13 designates bumps usually formed on the obverse surface of the IC chip 1. The bumps 13 are interposed between the IC chip 1 and the inner leads 11a.

A description will be given of a method for installing the IC chip 1 in the thus-constructed carrier tape 6. As shown in FIG. 10a, first, the IC chip 1 is placed in the center device hole 7 in the tape 6. The IC chip 1 or the tape 6 is positioned so that the bumps 13 on the IC chip 1 can face predetermined locations of the inner leads 11a. Next, the bumps 13 on the IC chip 1 are connected to the inner leads 11a by a thermocompression bonding method. This forms the tape carrier in which the IC chip 1 installed. FIG. 10b shows an example of such a tape carrier.

A method using a liquid resin for sealing the tape carrier will be described with reference to FIGS. 11a and 11b. In the drawings, numeral 14a indicates the liquid resin before it sets; 14b, the liquid resin after it has set; and 15, a syringe for dropping the liquid resin 14a. First, the liquid resin 14a is dropped onto the tape carrier shown in FIG. 11a, and then it is heated and thereby set to encapsulate the tape carrier, as illustrated in FIG. 11b.

The construction of the conventional semiconductor device and the manufacturing method employed therefor are as described above. Because of the following problems, there is a limit of 1.0 mm in making semiconductor devices thinner.

A comparison between the wire bonding and TAB methods will be explained first. FIGS. 12a and 12b are enlarged cross-sectional views illustrating the thicknesses of resin encapsulating IC chips in accordance with the wire-bonding method and the TAB method, respectively. In FIG. 12a, reference character A indicates the height of the wire 4 in accordance with the wire bonding method. The height A is usually 180 μm, and at least approximately 150 μm. Reference character B indicates the thickness of the sealing resin 5 provided for protecting the wire 4 and the electronic circuitry on the surface of the IC chip 1 from external contamination or moisture. In FIG. 12b, reference character C indicates the height of the bump 13 on the IC chip 1 which is usually about 25 μm. Reference character D indicates the thickness of the inner lead 11a (metal foil made of copper or the like) which is usually 35 μm.

It is obvious from the above measurements that when the thickness of the resin used in the wire bonding method is compared with that in the TAB method, the resin used in the TAB method can be made thinner by an amount equal to a thickness A−C−D. Usually, this resin is approximately 120 μm thick. Thus the TAB method is advantageous when thin semiconductor devices are manufactured, and, in fact, has hitherto been employed for manufacturing such devices.

As shown in FIGS. 11a and 11b, the liquid resin 14a seals the tape carrier in the conventional TAB method. It is known that this liquid resin 14a is generally less reliable than sealing resins used in the low-pressure transfer method. A pressure cooker test (PCT) is conducted at high temperature and under high pressure using liquid resin R1 and transfer mold resins R2 and R3. Table 1 shows the results of the PCT.

TABLE 1

| Resins | Classification | Amounts of PCT time required until reject rates reach the following values | | |
| --- | --- | --- | --- | --- |
| | | Reject rate 10% | Reject rate 50% | Reject rate 90% |
| R1 | Liquid | 24 hours | 48 hours | 56 hours |

TABLE 1-continued

| Resins | Classification | Amounts of PCT time required until reject rates reach the following values | | |
|---|---|---|---|---|
| | | Reject rate 10% | Reject rate 50% | Reject rate 90% |
| R2 | resin Transfer mold resin | 580 hours | 1400 hours | 2000 hours |
| R3 | Transfer mold resin | 610 hours | 1800 hours | 2800 hours |

Table 1 lists the amounts of test time (PCT time) required for the reject rates to reach 10%, 50% and 90%. It is understood that the reliability of the liquid resin R1 is approximately 1/10 to 1/20 that of the transfer mold resins R2 and R3.

We have tried to adapt the low-pressure transfer method to the TAB method, and have applied for patents (refer to Japanese Patent Publications Nos. 1-198041 and 1-155635). Apparently, the following five items are required for decreasing the thickness of a semiconductor device.

1) reduction of the amount each inner lead 11a droops
2) limitation of the variation of the inner lead droop
3) reduction, as much as possible, of the minimum melt viscosity of sealing resin
4) limitation of the amount a mold clamps the lead support portion 12 of the carrier tape
5) formation of a hole in the lead support portion 12 so that variations in the amount of resin pouring from above and under the lead portion 12 are limited.

We have already applied for patents regarding the fifth item (refer to Japanese Patent Publications Nos. 1-238031, 1-120835 and 1-244629).

The first, second and third items will be explained. FIG. 13a is a view used for illustrating the first item when a thin semiconductor device is manufactured. The low-pressure transfer method, using the TAB method, resin-seals the thin semiconductor device. When the carrier tape 6 and the IC chip 1 are bonded together according to the conventional TAB method, the amount E each inner lead 11a droops is not accurately controlled; consequently, drooping exceeding 100 μm is tolerable. Thus the thickness F of resin on the IC chip 1 will be thicker, by 100 μm or more, than the thickness (B+C+D) of the resin shown in FIG. 12b. In the low-pressure transfer method, the thickness of the resin on the IC chip 1 is basically the same as that of the resin beneath the IC chip 1. For this reason, the semiconductor device will be thicker than necessary and two times as thick as the amount E each inner lead 11a droops.

FIGS. 14a through 14c are views illustrating the above second and third items when a thin semiconductor device is manufactured. The thin semiconductor device is resin-sealed by the low-pressure transfer method using the TAB method. In the conventional TAB method, not only the amount E each inner lead 11a droops, but also a variation in the amounts all the inner leads 11a droop, is controlled. When this variation is not controlled, when molds 16a and 16b are designed on the basis of the measurements shown in FIG. 13b, showing a state in which each inner lead 11a does not droop, and when each inner lead 11a actually droops with a variation G, as shown in FIG. 14a, the thickness H of the resin on the IC chip 1 will increase from the standard thickness (B+C+D) by an amount equal to the variation G, and will become a total thickness (B+C+D+G).

On the other hand, the thickness J of the resin beneath the IC chip 1 will decrease from the standard thickness (B+C+D) by an amount equal to the variation G, and will be a total thickness (B+C+D−G). In the end, a difference between the thickness of the resin on the IC chip 1 and that of the resin beneath the IC chip 1 is twice the amount of the variation G. Since the thickness H of the thin semiconductor device is approximately 200 μm or less, if the variation G becomes as great as 50 μm, then the thickness H becomes approximately 250 μm, and the thickness J becomes approximately 150 μm. Thus the difference in thicknesses of the resins on and beneath the IC chip 1 becomes greater. For this reason, when the resin is introduced by the low-pressure transfer method, as shown in FIG. 14b, there will be a considerable difference in the amount the resin flows. As shown in FIG. 14b, because of this difference, the IC chip 1 is moved in a slight rotative manner in the direction indicated by arrow K. As the result, as depicted in FIG. 14c, a resin path beneath the IC chip 1 becomes extremely narrow, thus causing the resin to set while the resin is flowing and thus forming a void 17 beneath the IC chip 1. In an extreme case, there is a risk that the IC chip 1 will be exposed.

The amounts the inner leads 11a droop are examined so that not only the void 17 is prevented from being formed, but also the reverse surface of the chip 1 is prevented from being exposed. The formation of the void 17 and the exposure of the chip 1 are caused by the variation in the amounts the inner leads 11a droop. The result of this examination shows that when the variation is limited to 30 μm or less, the above problems will not occur. The viscosity of the sealing resin is also examined so that it is sufficient for preventing the IC chip 1 from being moved in a slight rotative manner when the inner leads 11a droop, as shown in FIG. 14b. The result of this examination indicates that when the minimum melt viscosity is limited to 200 P or less, the IC chip 1 will not be moved in a slight rotative manner.

SUMMARY OF THE INVENTION

The present invention has been made to solve the above problems, and accordingly, the object of the invention is to provide a manufacturing method for a thin and highly-reliable semiconductor device.

According to this invention, there is provided a manufacturing method for a semiconductor device in which an electrode of a semiconductor chip is electrically connected to an inner lead of a carrier tape, said manufacturing method comprising the steps of:

bringing the electrodes of the semiconductor chip into contact with respective inner leads supported by the carrier tape; and bonding the respective electrodes and leads so that the amount the inner lead droop is controlled to less than 80 μm.

DESCRIPTION OF THE PREFERRED EMBODIMENTS

The preferred embodiments of the present invention will described below with reference to the accompanying drawings.

Figure 1:
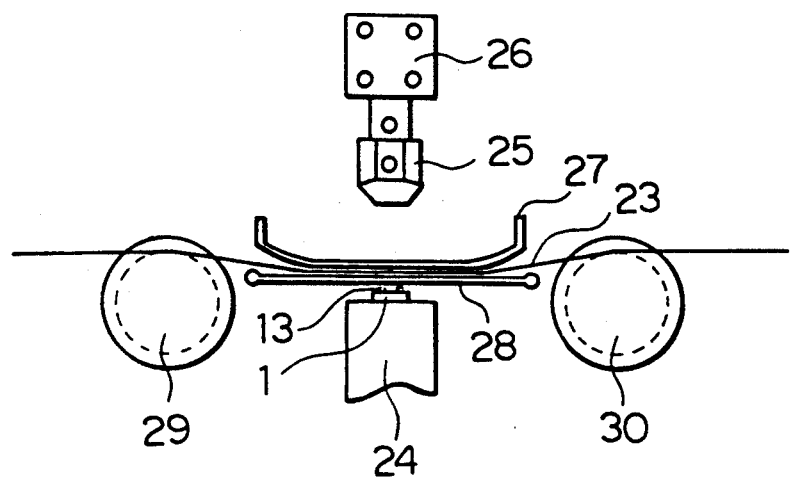
FIG. 1 is a schematic side view showing a bonding device.

As shown in FIG. 1, a bonding device has a tape guide 27 for guiding a carrier tape 23 and a tape clamp 28 for pressing the tape 23 against the guide 27 to secure the tape 23. A bonding stage 24 for retaining an IC chip 1 is disposed under the tape guide 27, and moves freely up and down. A bonding tool 25 coupled to an operating device 26 is disposed over the tape guide 27. A carrying guide 29 for carrying the carrier tape 23 is provided in back of the tape guide 27, whereas a carrying guide 30 for carrying the carrier tape 23 is provided in front of the tape guide 27.

In a first embodiment, the amount each inner lead 11a droops is reduced as much as possible, and specifically, to 80 $\mu$m or less as described below.

Figure 2A:
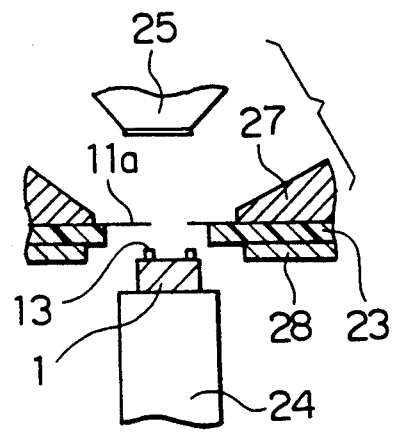
FIGS. 2a and 2b are schematic cross-sectional views showing the conventional bonding operation.
Figure 2B:
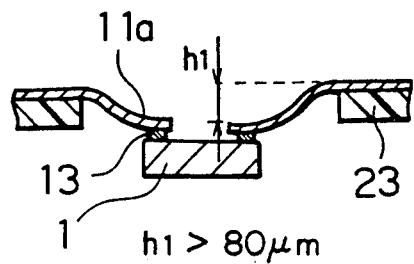
Figure 3A:
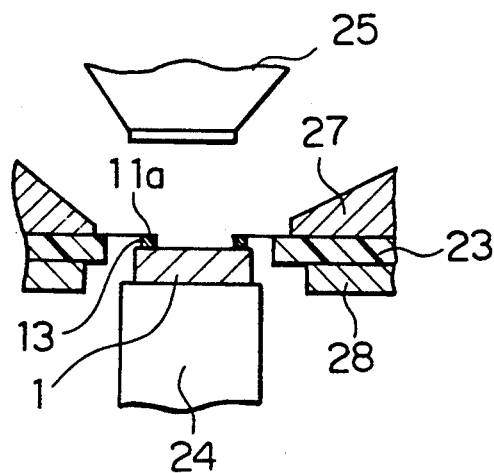
FIGS. 3a through 3c are schematic cross-sectional views showing bonding operations in accordance with an embodiment of the present invention.
Figure 3B:
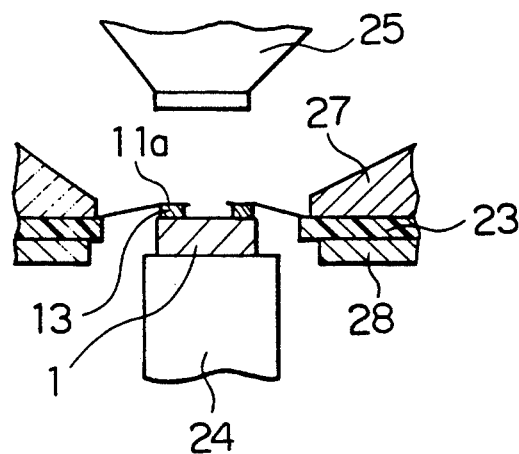
Figure 3C:
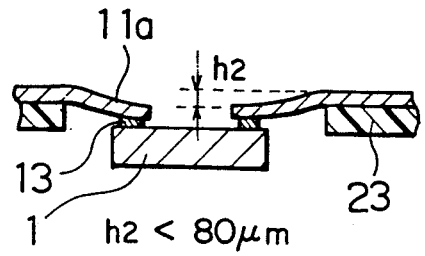

In FIGS. 2a and 2b, the amount each inner lead 11a droops after bonding depends heavily not only upon the amount each inner lead 11 of the carrier tape 23 droops before bonding, but also upon the relative positions of each inner lead 11a and each bump 13 when these components are positioned. As regards the former factor, a tape carrier from which each lead 11a droops little or a tape carrier having inner leads 11a which are intentionally deformed is employed. The employment of such a tape carrier can reduce the amount each inner lead 11a droops before bonding. As regards the latter factor, as shown in FIG. 2a, when each inner lead 11a is separated from each bump 13 while they are positioned for bonding, the amount h1 each inner lead 11a droops after bonding increases, as illustrated in FIG. 2b. The position of the bonding stage 24 of the bonding device is adjusted so that, as depicted in FIG. 3a, the inner lead 11a may come into contact with the bump 13, or so that, as depicted in FIG. 3b, the bump 13 pushes up the inner lead 11a about 20 $\mu$m at most. After the adjustment of the bonding stage 24 in this way bonding is performed. The amount each inner lead 11a droops can thus be limited to 80 $\mu$m or less, as shown in FIG. 3c.

In a second embodiment, a variation in the amounts the inner leads 11a droop is limited specifically to 30 $\mu$m or less as mentioned below.

The difference between the amount each inner lead 11a droops and a variation in the amounts all the inner leads 11a droop will be explained first. There is a measurement for each inner lead 11a which indicates the amount such an inner lead 11a droops. If one IC chip has 200 inner leads, there are 200 measurements of the amounts which the 200 inner leads droop. On the other hand, a variation in the amounts the inner leads droop indicates a value obtained by subtracting the minimum value from the maximum value of all the amounts the inner leads of one IC chip droop. There is thus only one variation for one IC chip. This variation also indicates the angle at which the IC chip inclines after bonding.

In this embodiment, the variation in the amounts the inner leads 11a droop is controlled in the following way. In FIG. 1, the tilt of the tape guide 27 holding the carrier tape 23 is adjusted so that it is parallel with the obverse surface of the bonding stage 24. This adjustment makes it possible to limit the variation in the amounts the inner leads 11a droop to 30 $\mu$m or less.

In a third embodiment, when the sealing resin is introduced, the IC chip 1 is prevented from being moved as mentioned below. An extremely low-viscosity sealing resin is employed under the following conditions: the fluidity of the resin is improved; while stress applied to the IC chip 1 is considered, the ratio at which a filler is contained in the resin is increased to 65% or more by weight, which corresponds to the ratio with the conventional resin; the linear expansion coefficient of the resin is decreased to $2.0 \times 10^{-5}$ or less, corresponding to that of the conventional resin; and the minimum melt viscosity of the resin is decreased to 200 P or less (preferably, to 100 P or less) at the molding temperature from 300–400 P, which is the normal viscosity. In short, by employing the above sealing resin having a viscosity lower than that of the conventional resin, the IC chip 1 is moved very little when the low-pressure transfer method introduces the sealing resin.

In a fourth embodiment, a package is thinned as described below, which package is a so-called plastic package in which the IC chip is electrically connected to an external electrode and resin sealing protects the IC chip from external surroundings. First, to thin the resin on the IC chip, what is called the TAB method is employed in place of the conventional wire bonding method for bonding the IC chip to the external electrode. The amount the inner lead droops, which amount has not hitherto been accurately controlled, is limited to 80 $\mu$m or less, as explained in the first embodiment. Any change in the position of the IC chip before being molded is limited, and any increase in the thickness of the resin is also limited. This increase is caused by the fact that IC chip 1 itself also droops. Next, the thickness of the IC chip is decreased from 0.4 mm, which is a value attained with the conventional method, to not more than 0.25 mm, which is a value close to the minimum value to which current IC chips can be thinned.

In a fifth embodiment, a sealing resin, having a thickness of 50 μm or more, encapsulates the IC chip, whereby the thickness of an entire package is limited to 0.6 mm or less. Such a technique is applied to a manufacturing method for a semiconductor device, whose IC chip is electrically connected to the external electrode. This semiconductor device is resin-sealed by the low-pressure transfer method so that the IC chip is protected from external surroundings. It is necessary to limit the thickness of a package to 0.6 mm or less in order to develop an IC, particularly that which can be built into an ISO card, having the same size as that of an ordinary cash card, which measures 85.6 mm long×54.0 mm wide×0.76 mm thick. A thickness of 0.6 mm is obtained as follows:

0.76 mm (thickness of the ISO card)−0.10 mm (thickness of the substrate)−0.06 (thickness of the armoring sheet)=0.6

An extremely low-viscosity sealing resin is employed under the following conditions: the fluidity of the resin is improved; while stress applied to the IC chip 1 is considered, the ratio at which a filler is contained in the resin is increased to 65% or more by weight, which corresponds to the ratio with the conventional resin; the linear expansion coefficient of the resin is decreased to $2.0 \times 10^{-5}$ or less, corresponding to that of the conventional resin; and the minimum melt viscosity of the resin is decreased to 200 P or less (preferably, to 100 P or less) at the molding temperature from 300–400 P, which is the normal viscosity.

Figure 4A:
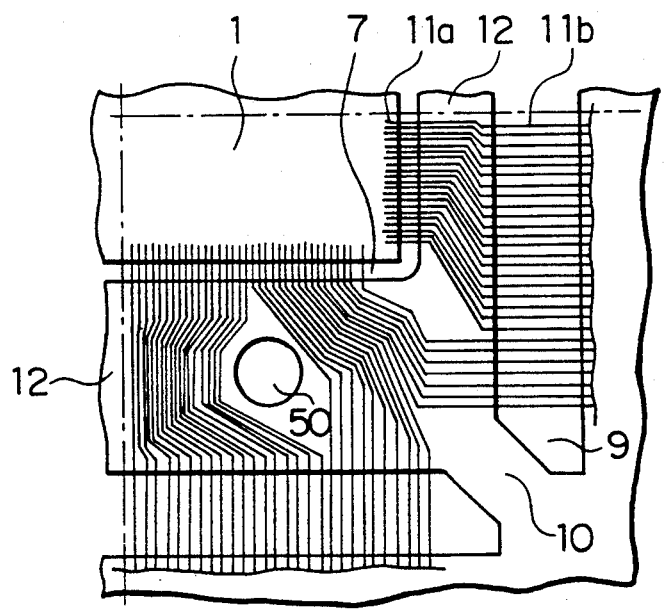
FIGS. 4a and 4b are a plan view and a sectional side elevation, respectively, of a tape carrier having a through-hole according to an embodiment of this invention.
Figure 4B:
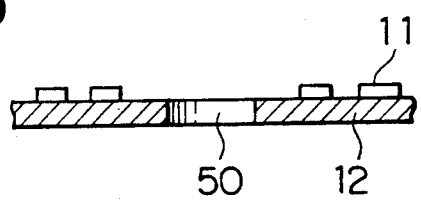
Figure 5:
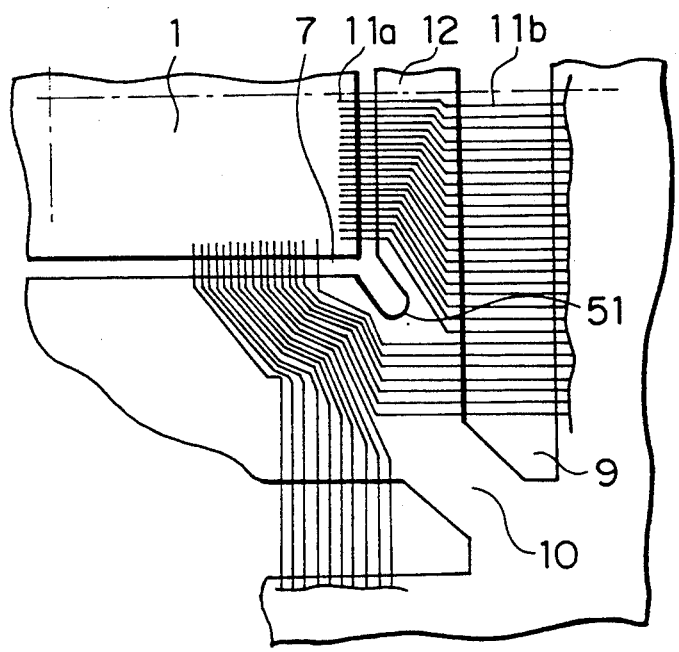
FIG. 5 is a plan view of a tape carrier having a notch according to another embodiment of the invention.

To reconcile the difference between flow properties on and those beneath the IC chip in a mold, a hole is formed in the lead support portion 12 so as to allow the resin to flow on and beneath the support portion 12 of the carrier tape used in the TAB method. A through-hole 50 shown in FIGS. 4a and 4b, and a notch 51 shown in FIG. 5, may be used as such a hole.

To limit variations in the position of the IC chip in the mold, (A) the second embodiment is employed to limit the variation in the amounts that the inner leads droop to 30 μm or less; (B) variations in the positions of upper and lower molds in contact with the IC chip are limited so that, after the lead support portion of the carrier tape has been displaced, the position of the IC chip in the mold does not change; and (C) the amount the carrier tape is clamped is controlled so that it is clamped in an amount equal to 30% or less of the thickness of the tape.

By employing the fourth embodiment, the following advantages can be obtained. Because a sealing resin is utilized which has a viscosity lower than that of the conventional sealing resin, the IC chip is moved little when the low-pressure transfer method introduces the sealing resin. A hole formed in the lead support portion of the carrier tape reconciles the difference between flow properties of the resin on opposite sides of the IC chip. The variation in the amounts the inner leads droop is limited, as a result of which limitation, variations in the position of the IC chip are also limited before the IC chip is molded. The amount the carrier tape is clamped is controlled so that it is clamped in an amount equal to 30% or less of the thickness of the tape. Such an amount inhibits the lead support portion of the carrier tape from being displaced in up and down directions.

Figure 6A:
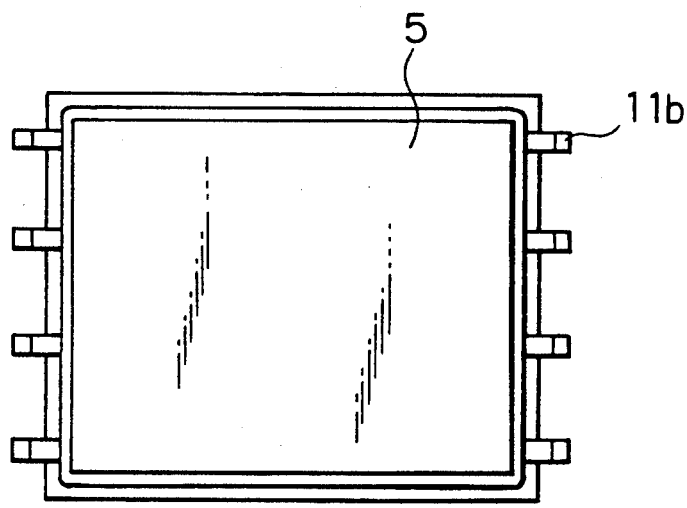
FIGS. 6a, 6b and 6c are a plan view, a side view and a partially enlarged cross-sectional view, respectively, showing an embodiment of a semiconductor device produced by the manufacturing method of this invention.
Figure 6B:
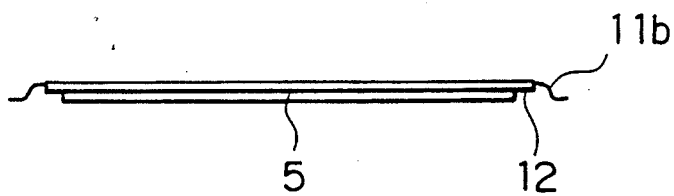
Figure 6C:
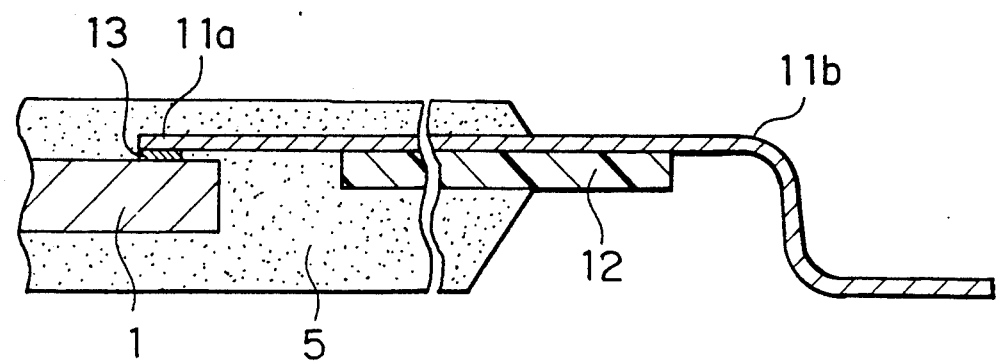

A combination of the fourth and fifth embodiments makes it possible to manufacture an extremely thin semiconductor device, having a thickness of not more than 0.6 mm, as shown in FIGS. 6a through 6c.

Figure 7A:
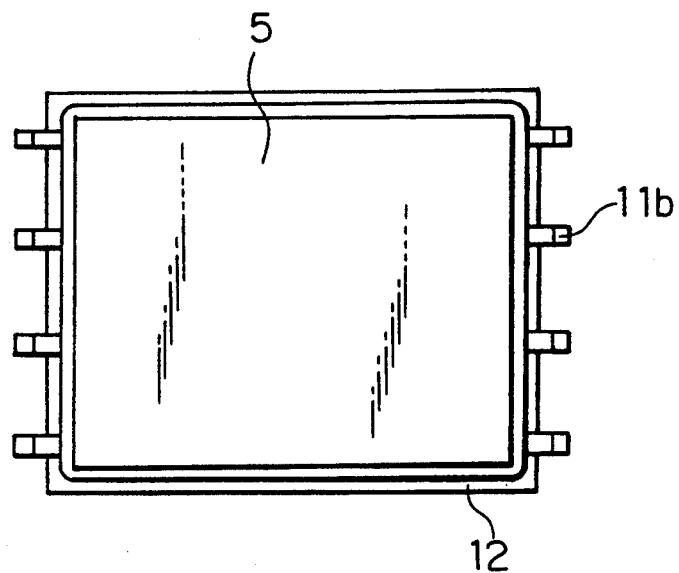
FIGS. 7a, 7b and 7c are a plan view, a side view and a partially enlarged cross-sectional view, respectively, showing another embodiment of a semiconductor device produced by the manufacturing method of this invention.
Figure 7B:
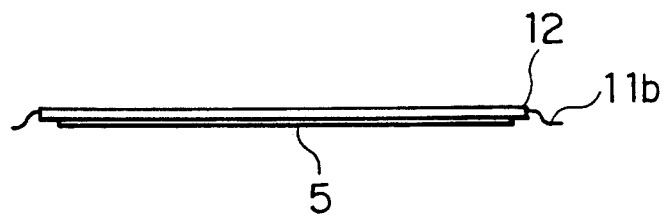
Figure 7C:
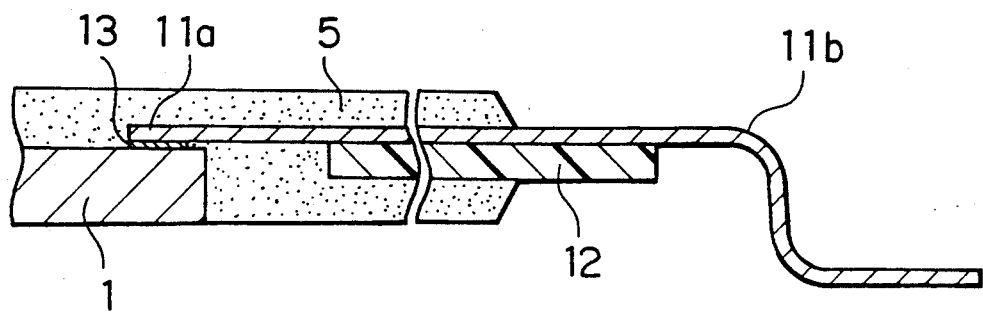
Figure 8:
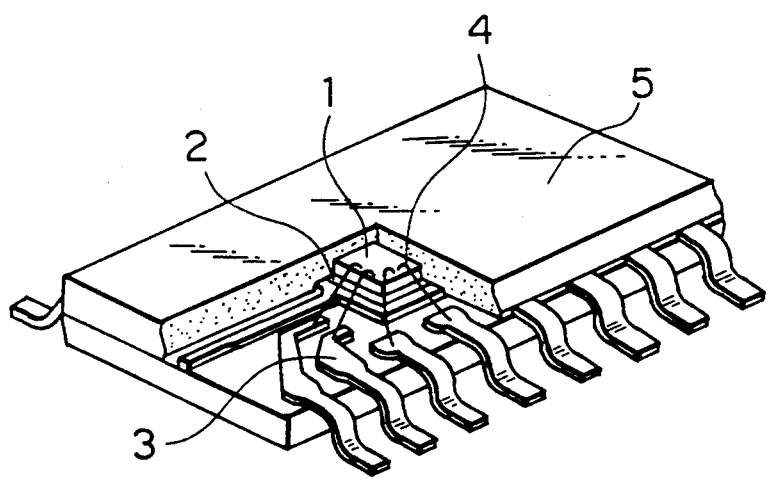
FIG. 8 is a perspective view partially in section of a conventional, wire-bonded and resin-sealed semiconductor device.
Figure 9A:
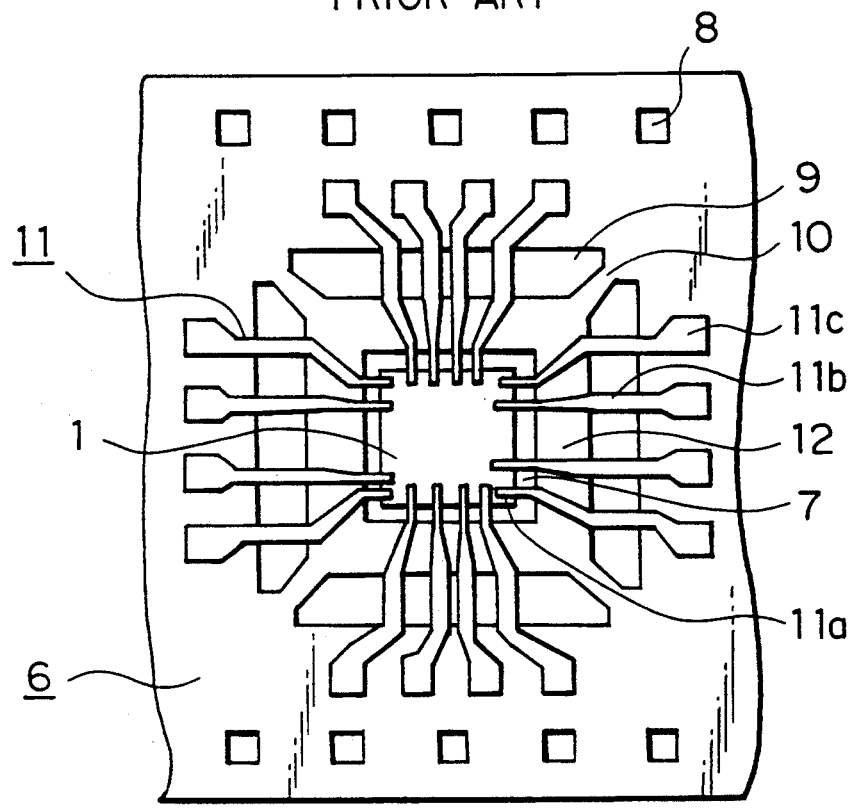
FIGS. 9a and 9b are a plan view and a sectional side elevation showing a tape carrier.
Figure 9B:
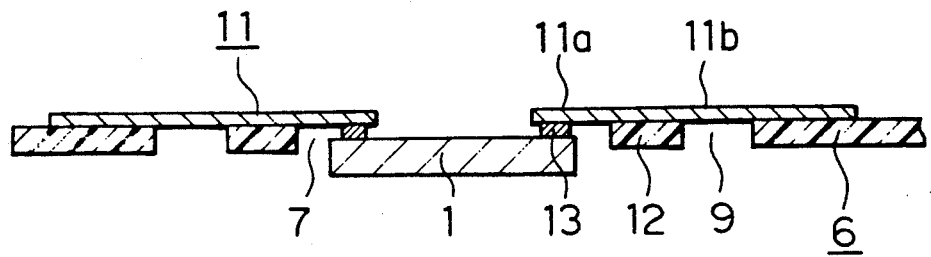
Figure 10A:
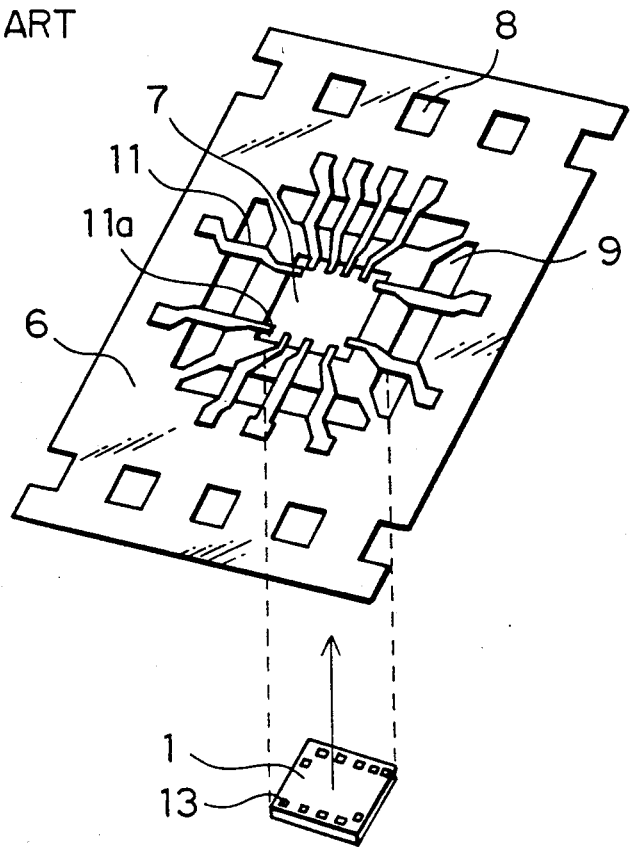
FIGS. 10a and 10b are perspective views showing a process in which a tape carrier and a semiconductor element are bonded together.
Figure 10B:
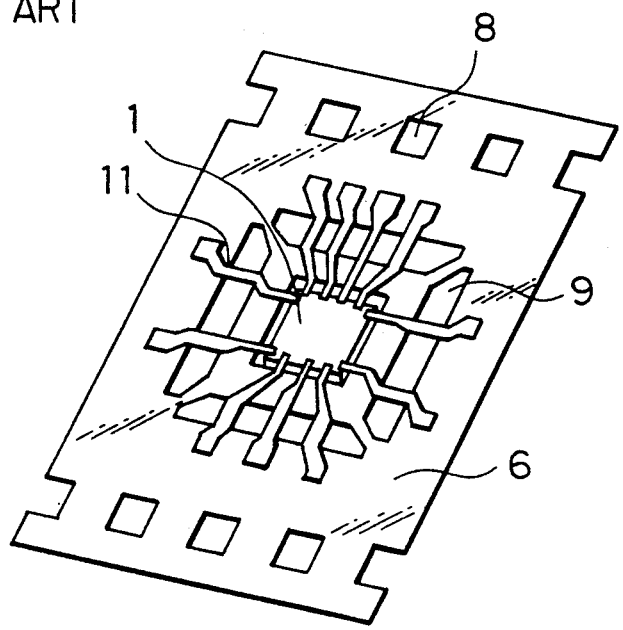
Figure 11A:
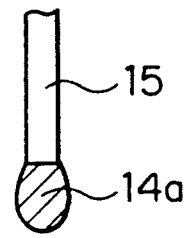
FIGS. 11a and 11b are cross-sectional views showing a process in which a liquid resin seals the tape carrier.
Figure 11A:
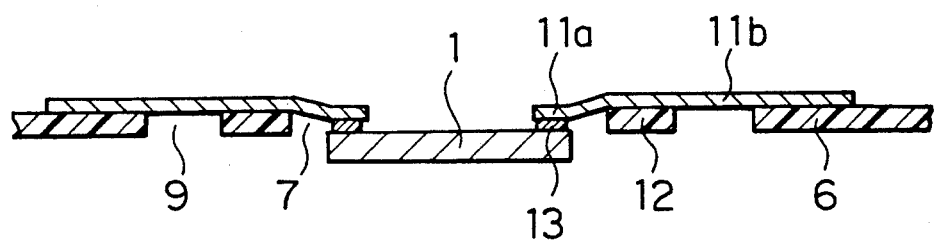
Figure 11B:
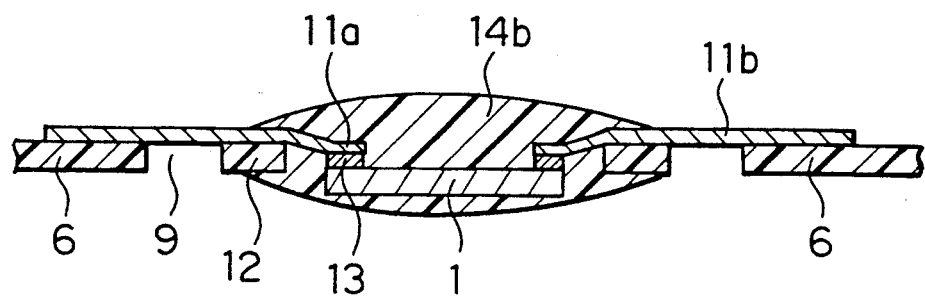
Figure 12A:
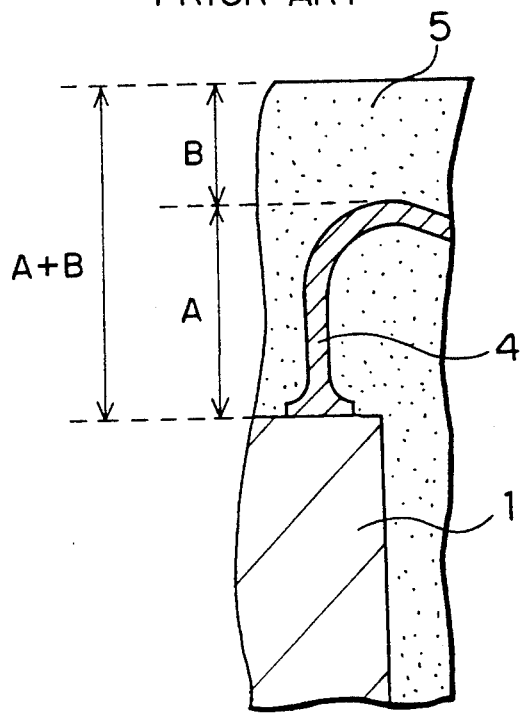
FIGS. 12a and 12b are enlarged cross-sectional views illustrating the thicknesses of resins on the IC chips in accordance with the conventional wire-bonding method and the TAB method, respectively.
Figure 12B:
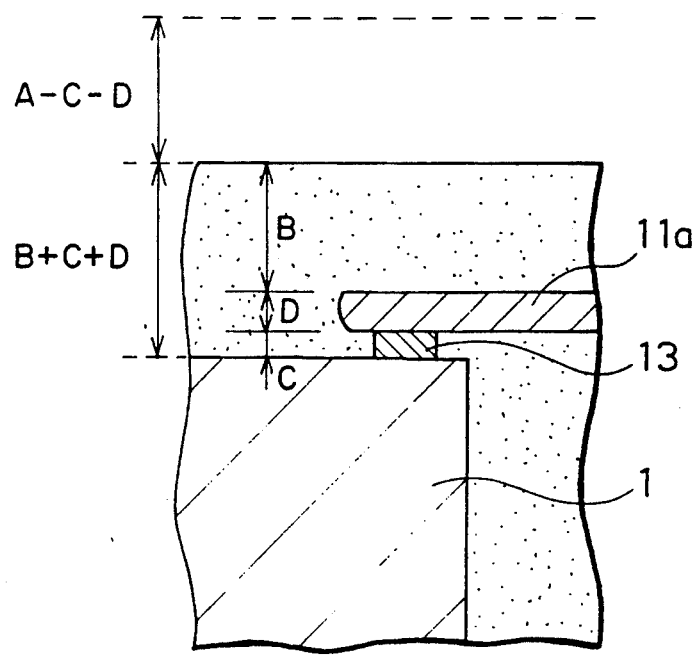
Figure 13A:
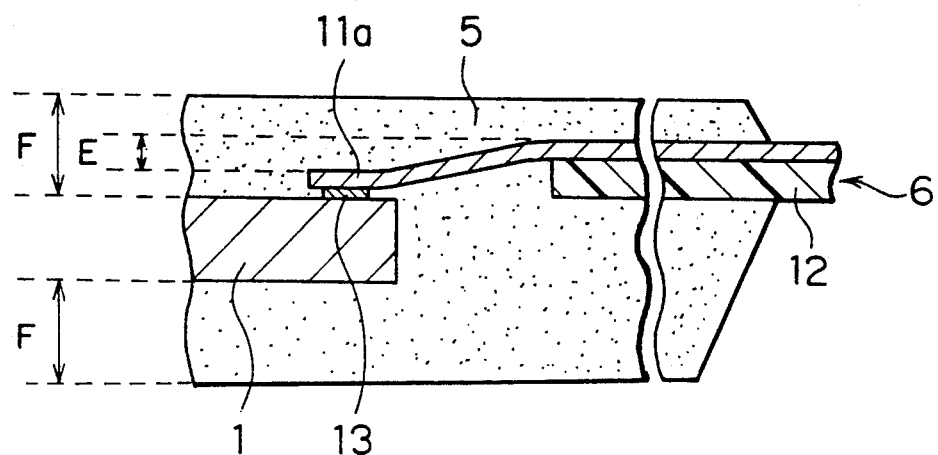
FIGS. 13a and 13b are cross sectional views showing the relationship between the amount each inner lead droops and the thickness of the resin on the IC chip in accordance with the TAB method.
Figure 13B:
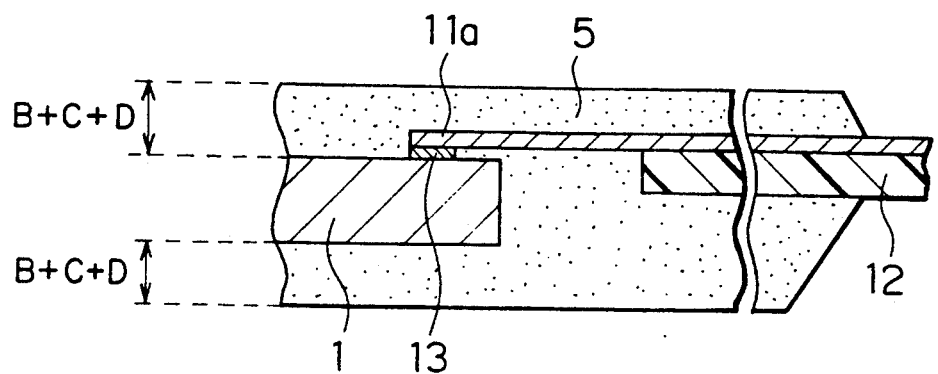
Figure 14A:
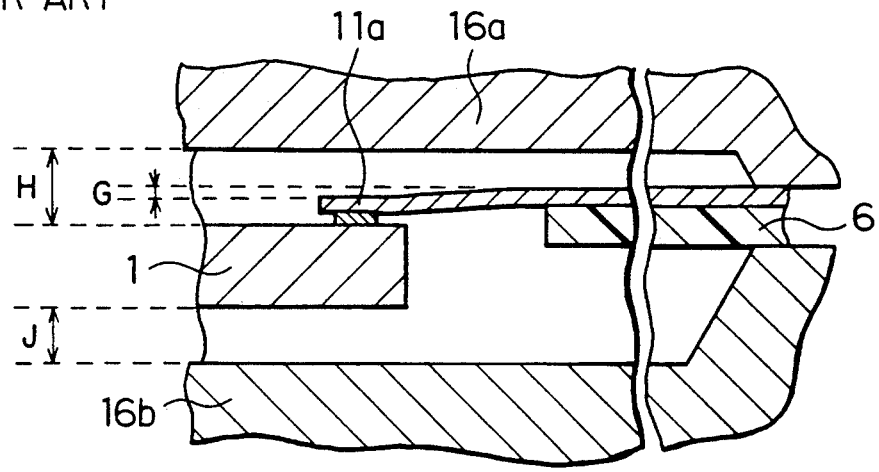
FIGS. 14a through 14c are cross sectional views showing the relationship between a variation in the amounts the inner leads droop and molding characteristics according to the TAB method.
Figure 14B:
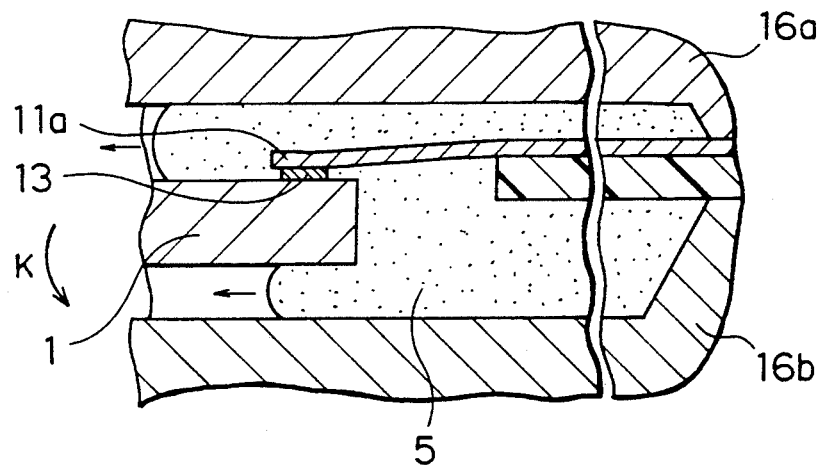
Figure 14C:
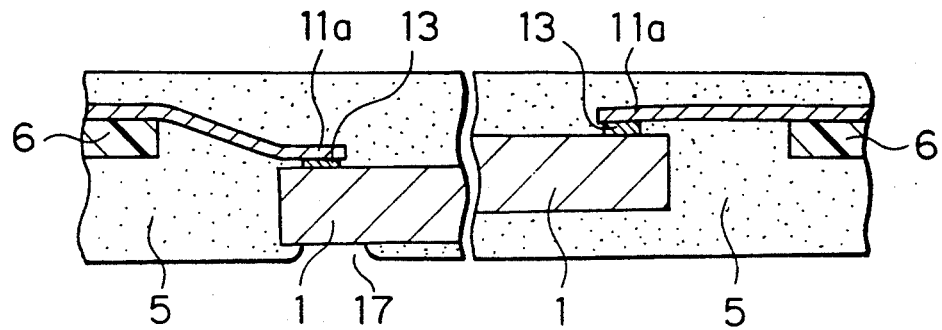

In the embodiments mentioned above, although the present invention is applied where the obverse and reverse surfaces of an IC chip are resin-sealed, it may also be applied where only the obverse surface of an IC chip is resin-sealed, as illustrated in FIGS. 7a through 7c. In such a case, it is possible to manufacture a semiconductor device having a thickness of not more than 0.5 mm.

What is claimed is:

1. A method of manufacturing a semiconductor device in which electrodes of a semiconductor chip are electrically connected to respective inner leads supported by a carrier tape comprising:
   bringing electrodes of a semiconductor chip into contact with respective inner leads supported by a carrier tape; and
   while urging the semiconductor chip and the carrier tape in opposite directions, thereby urging the inner leads supported by the carrier tape away from the carrier tape, bonding the electrodes to the respective inner leads whereby droop of the inner leads at the electrodes relative to the positions of the leads on the supporting carrier tape is no more than 80 μm.

2. The method claimed in claim 1 including resin encapsulating the semiconductor chip and carrier tape after bonding the respective electrodes and inner leads to protect the semiconductor chip.

3. The method claimed in claim 1 wherein the carrier tape is supported by and guided to the semiconductor chip by a tape guide comprising, before bringing the electrodes of the semiconductor chip into contact with respective inner leads supported by the carrier tape, adjusting the tilt of the tape guide supporting the carrier tape so that the carrier tape is parallel to the surface of the semiconductor chip on which the electrodes are present whereby, after bonding the electrodes to the respective inner leads, the droop of the inner leads at the electrodes relative to the positions of the leads on the supporting carrier tape is no more than 30 μm.

4. A method of manufacturing a semiconductor device in which electrodes of a semiconductor chip are electrically connected to respective inner leads supported by a carrier tape comprising:
   bringing electrodes of a semiconductor chip into contact with respective inner leads supported by a carrier tape;
   electrically connecting the electrodes of the semiconductor chip to respective inner leads supported by the carrier tape; and
   encapsulating the semiconductor chip and the carrier tape with a resin to protect the semiconductor chip by injection molding with a resin having a minimum melted viscosity of not more than 200 P at the injection molding temperature.

5. A method of manufacturing a semiconductor device in which electrodes of a semiconductor chip are electrically connected to respective inner leads supported by a carrier tape and the semiconductor chip and the carrier tape are encapsulated in a resin by injection molding to protect the semiconductor chip comprising:
   forming a flow passage in a lead support portion of a carrier tape so that encapsulating resin can flow between both sides of the carrier tape;

bringing electrodes of a semiconductor chip into contact with respective inner leads mounted on a carrier tape;

electrically connecting the electrodes of the semiconductor chip to respective inner leads supported by the carrier tape; and encapsulating the semiconductor chip and the carrier tape with a resin to protect the semiconductor chip by injection molding with a resin having a minimum melted viscosity of not more than 200 P at the injection molding temperature.

6. The method claimed in claim 5 including clamping no more than 30% of the thickness of the carrier tape during resin encapsulation of the semiconductor chip and the carrier tape.

* * * * *